(12) United States Patent
Kawamura

(10) Patent No.: US 6,707,714 B2
(45) Date of Patent: Mar. 16, 2004

(54) READ DISTURB ALLEVIATED FLASH MEMORY

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/277,151

(22) Filed: Oct. 22, 2002

(65) Prior Publication Data

US 2003/0137873 A1 Jul. 24, 2003

(30) Foreign Application Priority Data

Jan. 22, 2002 (JP) .......................................... 2002-012984

(51) Int. Cl.[7] .............................................. G11C 16/04
(52) U.S. Cl. ............................. 365/185.11; 365/185.09; 365/185.23
(58) Field of Search .................. 365/185.09, 185.11, 365/185.12, 185.17, 185.23, 185.33

(56) References Cited

U.S. PATENT DOCUMENTS 5,652,450 A * 7/1997 Hirano ......................... 257/323
5,872,737 A * 2/1999 Tsuruda et al. ............ 365/189.05
5,917,766 A * 6/1999 Tsuji et al. .................... 365/201
6,353,555 B1 * 3/2002 Jeong ....................... 365/185.11

* cited by examiner

Primary Examiner—Gene Auduong
(74) Attorney, Agent, or Firm—Arent Fox Kintner Plotkin & Kahn, PLLC

(57) ABSTRACT

A memory cell array of a NAND-type flash memory is divided into a first and second cell arrays, and, during a read operation, a first voltage is applied to non-selected word lines of the first cell array, and a second voltage lower than the first voltage is applied, to non-selected word lines of the second cell array. The first cell array has a comparatively large write operation frequency, and therefore readily assumes an over-programmed state as a result of repeated write operations, whereas the second cell array has a comparatively small write operation frequency, and it is therefore difficult for same to assume an over-programmed state. As a result, the first voltage is made high, such that read problems are avoided even if over-programming arises, and the second voltage is made low, such that a read disturb is suppressed and a data change is avoided.

13 Claims, 7 Drawing Sheets

A > BA : EN1 = 0, EN2 = 1
A < BA : EN1 = 1, EN2 = 0

READ DISTURB ALLEVIATED FLASH MEMORY

BACKGROUND OF THE INVENTION

1. Field of the Invention

The present invention relates to a flash memory, which is a nonvolatile memory, and more particularly to a read disturb alleviated NAND-type flash memory.

2. Description of the Related Art

Semiconductor nonvolatile memory is capable of storing data even when the power supply is turned off, and is widely utilized in mobile information terminals, mobile telephones, and the like. Semiconductor nonvolatile memory includes NOR-type and NAND-type flash memory, and of these, NAND-type flash memory is high-capacity memory in widespread use.

With conventional NAND-type flash memory, a plurality of segments are connected to bit lines, and each of the segments comprises a plurality of memory cells which are connected to form vertical rows. Further, segments selected by segment select signals are connected to bit lines to become the objects of read and write operations. A plurality of segments, which is connected to the bit lines by means of these segment select signals, constitutes a memory cell block. Segment select signals are therefore memory cell block select signals.

Further, within a selected memory cell block, during a read operation, a high voltage is applied to non-selected word lines within a segment such that cell transistors are controlled to assume a conductive state irrespective of stored data, and an intermediate voltage of stored data "1", "0" is applied to selected word line within a segment such that, in accordance with stored data, selected cell transistors are controlled in a conductive or non-conductive state. For example, 0V is applied to the selected word line and 4V is applied to non-selected word lines.

Flash memory cell transistors have a constitution in which a floating gate and a control gate are formed, via an insulating layer, on a channel region between a source region and a drain region which are formed in a semiconductor substrate surface. Further, during programming, a high voltage is applied to the control gate and the drain. In accordance with the tunneling phenomenon, charge (electrons) is (are) injected into the floating gate, which makes the threshold voltage thereof high. This constitutes a programmed state (data 0). Further, during an erase operation, a low voltage (or a negative voltage) is applied to the control gate, and a high voltage is applied to the source, such that charge is extracted from the floating gate, which makes the threshold voltage thereof low. This constitutes an erased state (data 1).

NAND-type flash memory exhibits the problems of read disturb and over-programming. In a read disturb, since a relatively high voltage is applied to non-selected word lines within a selected block (selected segments), memory cells, which are connected to non-selected word lines, assume a light programming operation state during a read operation. As a result of being subject to such field stress, the amount of charge within the floating gate increases, which in turn raises the memory cell threshold voltage. As a result, the threshold voltage of a memory cell in an erased state (data 1) increases, and is sometimes changed to a programmed state (data 0). Since a NAND-type flash memory is constituted by segments, during a read operation there is a requirement to apply a high voltage to non-selected word lines which make up the majority of the word lines within a selected block. As a result, in comparison with a NOR-type flash memory, this read disturb phenomenon has a greater influence.

In order to suppress this read disturb phenomenon, the voltage applied to non-selected word lines may simply be set low. However, if the voltage of non-selected word lines is made low, this causes read problems with respect to over-programmed memory cells.

In over-programming, programming and erase operations (same are combined for a write operation) with respect to a memory cell are performed a large number of times, and this phenomenon arises upon degradation of the tunnel oxide film which lies between the drain and the floating gate of the memory cell. In other words, as a result of degradation of the tunnel oxide film, even with the same programming operation, excess electrons are applied to the floating gate such that the threshold voltage thereof becomes excessively high. This constitutes an over-programmed state.

Consequently, a memory cell, which has been frequently subjected to a write operation (programming and erasing), readily assumes an over-programmed state. Since the threshold voltage of a memory cell in an over-programmed state is high, in a read operation, if the voltage of non-selected word lines is set low, the non-selected word lines cannot be made to conduct, which in turn causes read problems.

SUMMARY OF THE INVENTION

It is accordingly an object of the present invention to provide a nonvolatile memory in which read disturb is suppressed and read problems do not arise with respect to a memory cell in an over-programmed state.

In order to resolve the above-mentioned objects, one aspect of the present invention is characterized by dividing a memory cell array of a NAND-type flash memory into a first cell array and a second cell array, and, during a read operation, applying a first voltage to non-selected word lines of the first cell array, and applying a second voltage, which is lower than the first voltage, to non-selected word lines of the second cell array. The first cell array has a comparatively large write operation frequency, and therefore readily assumes an over-programmed state as a result of repeated write operations, whereas the second cell array has a comparatively small write operation frequency, and it is therefore difficult for same to assume an over-programmed state. As a result, the voltage of non-selected word lines of the first cell array is made high, such that read problems are avoided even if over-programming arises, and the voltage of non-selected word lines of the second cell array is made low, such that a read disturb is suppressed and a data change is avoided.

A variety of methods exist for such division into a first cell array and a second cell array, namely a method for respectively allocating first and second cell arrays to: a cell array (or memory cell block), of which the address is higher than a prescribed boundary address, and a cell array (or memory cell block) of which the address is lower than the prescribed boundary address; and a method for allocating first and second cell arrays individually to a plurality of memory cell blocks. Further, by enabling this setting to be made externally, a user is then able to customize such setting.

DESCRIPTION OF THE PREFERRED EMBODIMENTS

The embodiments of the present invention will be described hereinbelow with reference to the drawings. However, the scope of protection of the present invention is not limited to or by the embodiments hereinbelow, but rather is intended to cover the inventions appearing in the claims and equivalents thereof.

Figure 1:
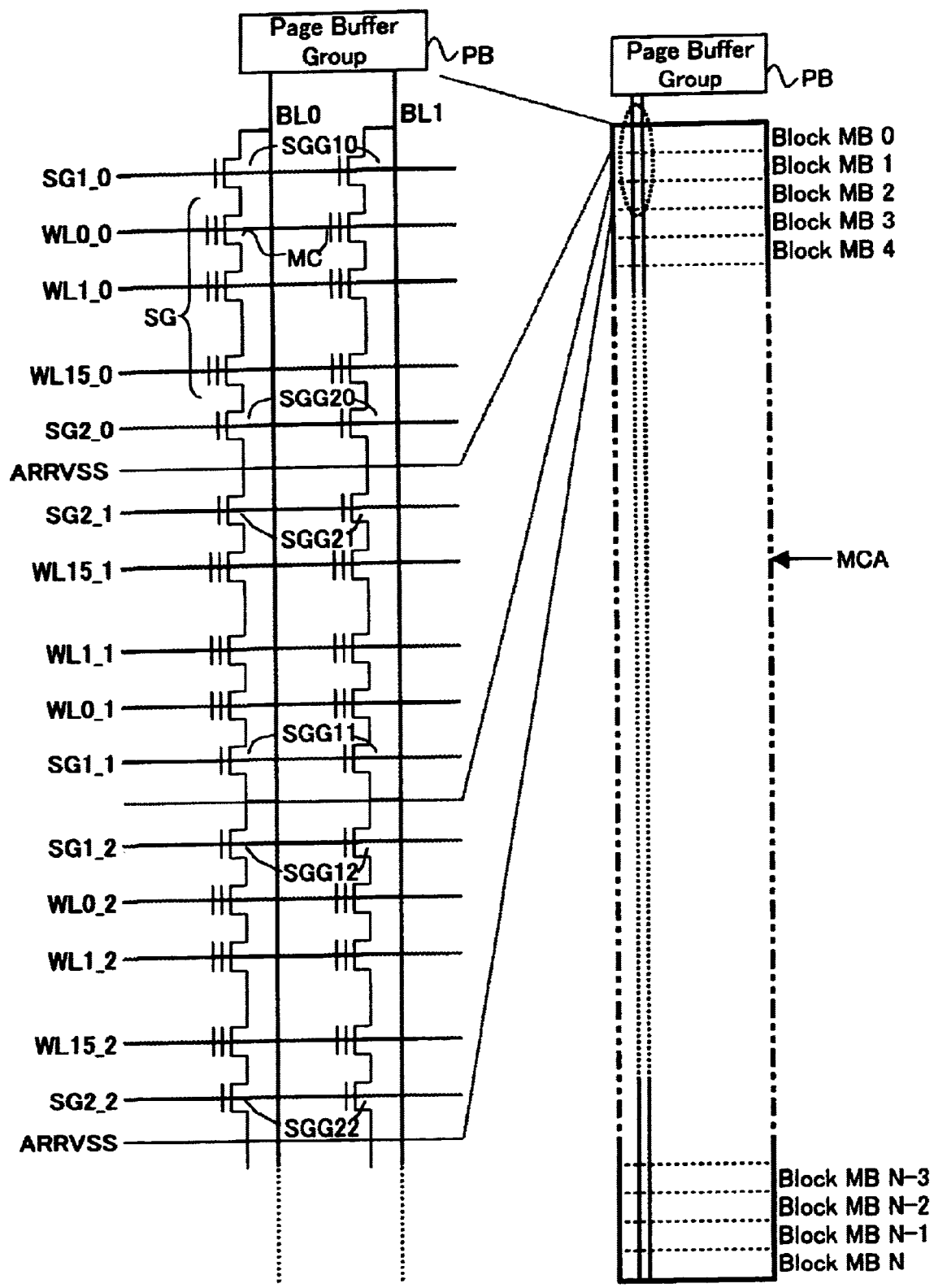
FIG. 1 shows a constitution of a memory cell array of a NAND-type flash memory.

FIG. 1 shows a constitution of a memory cell array of a NAND-type flash memory. The memory cell array MCA is divided into N memory cell blocks MB0 to MBN. Provided within the memory cell array MCA are: a plurality of bit lines BL, a plurality of segments SG, which are connected to the bit lines; a plurality of memory cells MC, which are provided in each segment; and a plurality of word lines WL, which are connected to the memory cells MC.

A plurality (sixteen in the figure) of memory cells MC are connected in vertical rows in segments SG, being connected on one side via first segment gates SGG10, SGG11, SGG12 to bit lines BL, and being connected on the other side via second segment gates SGG20, SGG21, SGG22 to a cell array source voltage ARRVSS.

Further, in a read operation, when the memory cell block MB0 is selected, for example, the segment select signals SG10, SG20 are controlled to assume an H level, such that first and second segment gates SGG10, SGG20 are conductive and segments, each comprising sixteen memory cells, are connected between the bit lines BL and the cell source voltage ARRVSS. Of sixteen word lines which are connected to the sixteen memory cells MC, a high voltage is applied to fifteen non-selected word lines, and an intermediate voltage for a threshold voltage corresponding to data "0" and "1" is applied to one selected word line. By way of example, a voltage of 4V or lower is applied to the non-selected word lines and 0V is applied to the selected word line.

As a result, of sixteen memory cells within a segment, fifteen non-selected memory cells all assume a conductive state, and only one selected memory cell is conductive or non-conductive in accordance with stored data. Accordingly, a state arises in which current flows or does not flow in the bit lines BL. Page buffers PB, which are connected to the bit lines BL0, BL1, detect the presence or absence of this bit line current and thus latch readout data.

Further, during a programming operation, the segment is similarly connected to the bit lines BL, and control is such that the bit lines BL, which have memory cells to be programmed connected thereto, are at 0V and the selected word line is at a high potential. Thus, charge (electrons) is (are) injected from the drain of the selected memory cell into the floating gate thereof as a result of the tunneling phenomenon. Accordingly, the threshold voltage of this memory cell becomes a positive voltage.

On the other hand, during an erase operation, in all segments within a selected memory cell block, control is such that the bit lines BL assume a floating state, all the word lines are at a negative voltage, and the cell array source voltage ARRVSS is of a floating state or is a high voltage. As a result, in all the memory cells, the charge within the floating gate is extracted to the source, and the threshold voltage of all the memory cells becomes a negative voltage.

Figure 2:
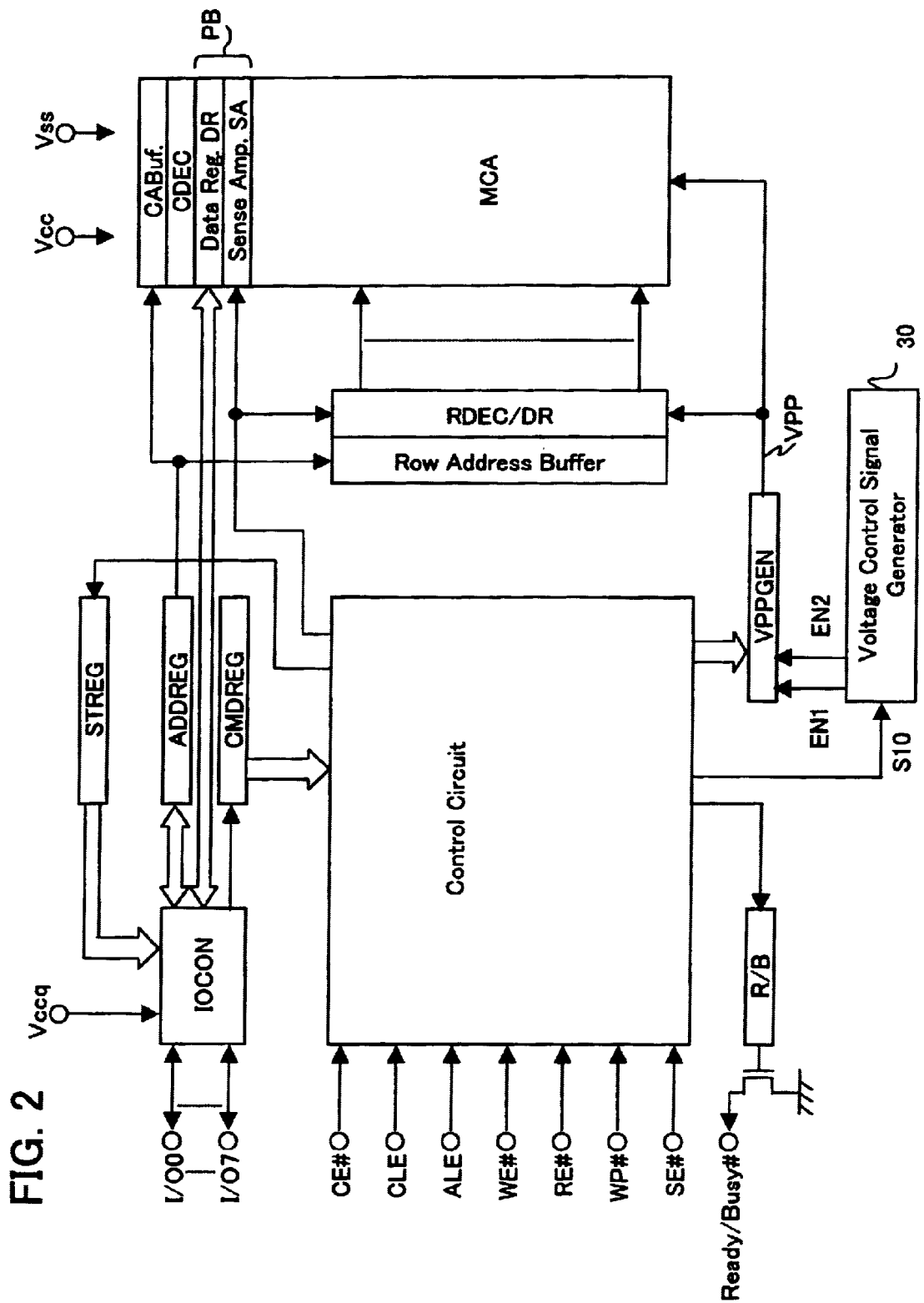
FIG. 2 is an overall constitutional view of a NAND-type flash memory.

FIG. 2 is an overall constitutional view of a NAND-type flash memory. Provided adjacent to the memory cell array MCA are: a row address buffer RABuf, in which row addresses are temporarily stored; a row decoder/driver RDEC/DR, which decodes the row addresses and drives the word lines; a sense amplifier SA, which detects the bit line states of the memory cell array; a page buffer PB, which comprises a data register DR that stores the detected data; a column address buffer CABuf; and a column address decoder CDEC. In a read operation, the row decoder/driver RDEC/DR drives selected word lines at a selected word line potential, and drives non-selected word lines at a non-selected word line potential.

The memory further comprises an I/O control circuit IOCON, which controls inputs of addresses, data, and commands, which are supplied from input/output terminals I/O0 to I/O7, and controls output of data; and a control circuit CONT, which controls internal operations by inputting control signals, namely a chip enable signal CE#, a command latch enable signal CLE, an address latch enable signal ALE, a write enable signal WE#, a read enable signal RE#, a write protect signal WP#, a spare enable signal SE#, and the like.

The memory also comprises a ready/busy output circuit R/B, which, during a program operation, an erase operation, and a data transfer from a memory cell to the page buffer PB, outputs a busy signal; and a high voltage generation circuit VPPGEN, which generates a higher voltage VPP than a supply voltage. The high voltage VPP, which is generated by the high voltage generation circuit, is a voltage applied to non-selected word lines during a read operation. Further, the high voltage VPP is also a voltage which is applied to selected word lines during programming.

The high voltage generation circuit VPPGEN is supplied with voltage control signals EN1, EN2, and generates a non-selected word line voltage during a read operation in accordance with these voltage control signals EN1, EN2. The voltage control signals EN1, EN2 are generated by a voltage control signal generation circuit 30. A detailed description of this voltage control signal generation circuit will be provided hereinafter.

The control circuit CONT controls corresponding internal operations in accordance with commands in a command register CMDREG and with the above-mentioned control signals. An address register ADDREG temporarily stores addresses inputted from outside and supplies these addresses to the two address buffers CABuf, RABuf. Further, a status register STREG stores internal status signals for a chip ready state, a state that a programming and erase operation has been completed normally, a write protect state, and so forth, and externally outputs these status signals via the I/O control circuit IOCON.

Figure 3:
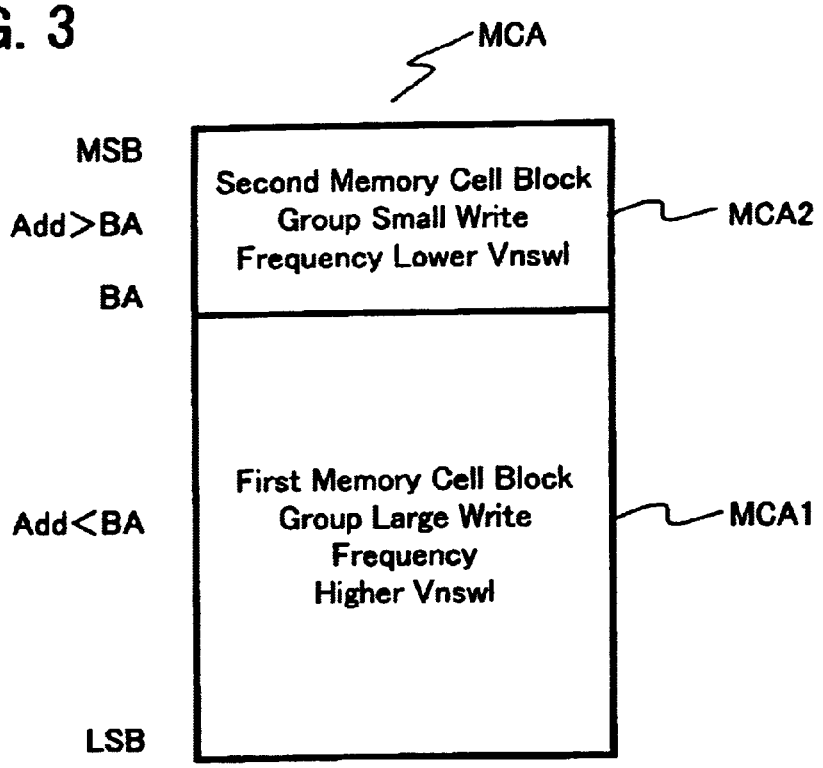
FIG. 3 shows a constitutional example of a memory cell array of the present embodiment.

FIG. 3 shows a constitutional example of a memory cell array of the present embodiment. As shown in FIG. 1, the memory cell array MCA is constituted by a plurality of memory cell blocks. Further, in the example in FIG. 3, a region, of which the address is lower than a boundary address BA, is allocated to a first memory cell block group MCA1 having a large write frequency; and a region, of which the address is higher than the boundary address BA, is allocated to a second memory cell block group MCA2 which is restricted so as to have a small write frequency.

The first memory cell block group MCA1 is a memory cell array which, similarly to the prior art, assures an ordinary rewrite frequency, and therefore assures a comparatively large write frequency which is assured by way of specification. Accordingly, there is the possibility that a memory cell will assume an over-programmed state, and a read-time non-selected word line voltage Vnswl is set comparatively high. It is thus possible to avoid read problems.

On the other hand, the second memory cell block group MCA2 is a memory cell array region which is restricted so as to have a comparatively low rewrite frequency (a rewrite frequency smaller than that of the first memory cell block group at least). Consequently, the probability of an over-programmed state being assumed is low, rather, in order to avoid a data change as a result of a read disturb during a read operation, the non-selected word line potential Vnswl is set lower than that for the first memory cell block group. Since, in the second memory cell region, the probability of an over-programmed state being assumed is low, even if the voltage of the non-selected word lines is set low, the probability of read problems arising is low.

Figure 4:
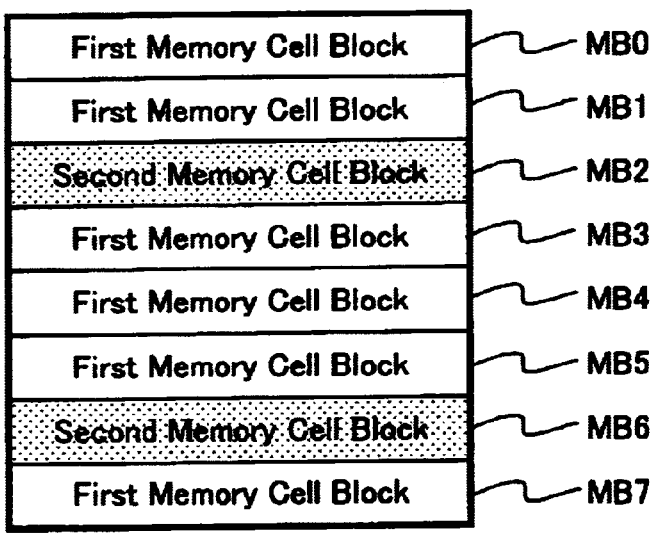
FIG. 4 shows another constitutional example of a memory cell array of the present embodiment.

FIG. 4 shows another constitutional example of a memory cell array of the present embodiment. As shown in FIG. 1, the memory cell array MCA is constituted by a plurality of memory cell blocks. Further, in the example in FIG. 4, of eight memory cell blocks MB0 to MB7, two memory cell blocks MB2, MB6 are allocated to the second memory cell blocks, and the remaining six memory cell blocks are allocated to the first memory cell blocks.

For this allocation, a process may be suitably performed prior to shipping or may be suitably performed by the user after shipping. In addition, it is possible to allocate optional memory cell blocks to the second memory cell blocks. However, once allocation to the first memory cell blocks has been carried out, changes to the second memory cell blocks are subsequently prohibited. After allocation has been made to the second memory cell blocks, changes to the first memory cell blocks are permitted. Such allocation changes can also be performed by a memory controller, or can be performed by rewriting to a memory for storing the block addresses of the second memory cell blocks as described hereinafter.

Also in FIG. 4, the first memory cell blocks are assured a comparatively high rewrite frequency, and the read-time non-selected word line voltage is correspondingly set comparatively high. The second memory cell blocks are assured only a comparatively low rewrite frequency, and the read-time non-selected word line voltage is correspondingly set comparatively low.

In the example in FIGS. 3, 4, the second memory cell block region has a restricted rewrite frequency, and can be employed, for example, as a ROM. The second memory cell block region can be used as a memory region in which a boot program for computer, a control program for computer, or the like, are stored, for example. On the other hand, the first memory cell block region can be utilized as ordinary flash memory, it being possible to perform data programming and erase operations as far as a write frequency which is assured by means of specification. The first memory cell block region can therefore utilized as a random access memory region for storing data.

Figure 5:
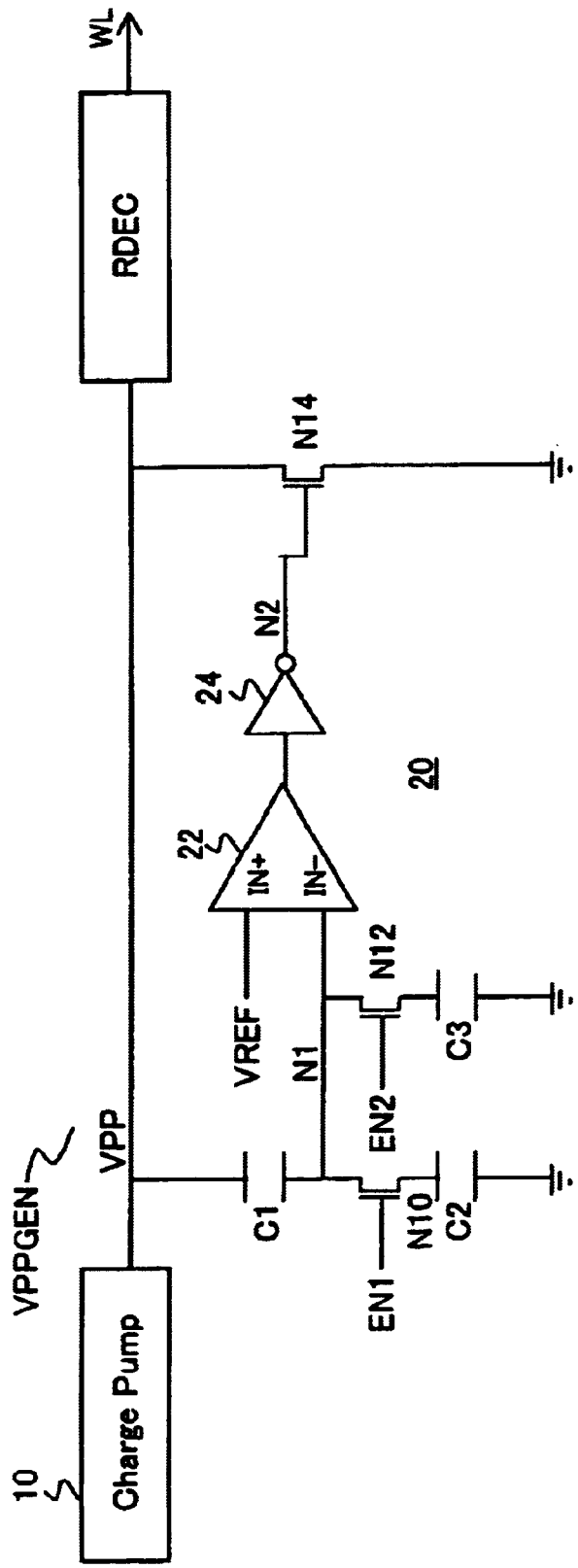
FIG. 5 shows a voltage control circuit which controls a high voltage.

FIG. 5 shows a voltage control circuit which controls a high voltage. The high voltage generation circuit VPPGEN comprises a charge pump circuit 10, which generates a high voltage VPP, and a voltage control circuit 20, which, in accordance with supplied voltage control signals EN1, EN2, adjusts the potential of the high voltage VPP generated by the charge pump circuit 10. The voltage control circuit 20 generates a potential, which corresponds to a boost voltage VPP produced by the charge pump circuit 10, at a node N1, compares the potential of the node N1 and a reference potential VREF, controls a transistor N14 conductive or non-conductive according to a result of this comparison, so as to control the boost voltage VPP to be a prescribed potential.

The node N1 is a connection point between a coupling capacitance C1, and a coupling capacitance C2 or C3 selected in accordance with the voltage control signals EN1, EN2, and the boost voltage VPP has a potential which drops in accordance with the ratio between these coupling capacitances. The capacitances C2, C3 are related such that C2>C3. During a read operation, when the first memory cell array region is selected, the first voltage control signal EN1 assumes an H level, and when the second memory cell array region is selected, the second voltage control signal EN2 assumes an H level.

When the first voltage control signal EN1 assumes an H level, the transistor N10 assumes a conductive state, and the potential of the node N1 is then VPP*C1/(C1+C2) in accordance with the capacitances C1, C2. On the other hand, when the second voltage control signal EN2 assumes an H level, the transistor N12 assumes a conductive state, and the potential of the node N1 is then VPP*C1/(C1+C3) in accordance with the capacitances C1, C3. Since the capacitances C2, C3 are C2>C3, the potential of the node N1 is lower when EN1=H than when EN2=H. A comparison circuit 22 compares the potential of the node N1 and the reference potential VREF, and supplies the comparison result via an inverter 24 to the gate of the voltage control transistor N14. When N1>VREF, the comparison circuit 22 outputs an L level, and the transistor N14 is controlled to assume a more conductive state, and the boost voltage VPP drops. When the boost voltage VPP drops, the potential of the node N1 also drops, the comparison circuit 22 outputs an H level, the transistor N14 is controlled to assume a more non-conductive state, and the boost voltage VPP rises. Thus, the boost voltage VPP then balances at a level that depends on the potential of the node N1.

Consequently, since the potential of the node N1 is lower when EN1=H, the boost voltage VPP balances in a state in which same is adjusted to a higher potential. On the other hand, because the potential of the node N1 is, when EN2=H, higher than that described above, the boost voltage VPP balances in a state in which same is adjusted to a lower voltage than that above. This adjusted boost voltage VPP is supplied to the row decoder RDEC and is employed as the potential of the non-selected word lines. In other words, when the first memory array group is selected, the boost voltage VPP is then higher, and the potential of the non-selected word lines during a read operation becomes comparatively higher. On the other hand, when the second memory cell array group is selected, the boost voltage VPP is comparatively lower than that above, and the potential of the non-selected word lines during a read operation becomes comparatively lower.

In the present embodiment, the above-mentioned reference potential VREF is set at 1.3 V, for example, and control is performed such that, when EN1=H, the boost voltage VPP=4.0 V, and such that, when EN2=H, the boost voltage VPP=3.6 V.

Figure 6:
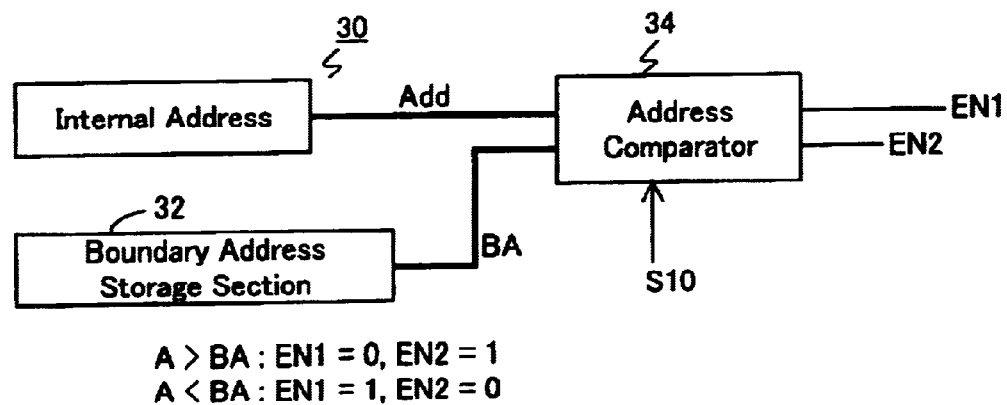
FIG. 6 shows an example of a voltage control signal generation circuit.

FIG. 6 shows an example of a voltage control signal generation circuit. This voltage control signal generation circuit 30 corresponds to the memory cell array constitution shown in FIG. 3, and compares, using an address comparison section 34, a boundary address BA, which is set in the boundary address storage section 32 at the time of shipping or by a user, and an internal address Add, which selects a memory cell block, such that, if the internal address Add is lower than the boundary address BA, the first voltage control signal EN1 is controlled to assume an H level, and the second voltage control signal EN2 is controlled to assume an L level. Further, if the internal address Add is equal to or higher than the boundary address BA, the first voltage control signal EN1 is controlled to assume an L level, and the second voltage control signal EN2 is controlled to assume an H level.

A boundary address storage section 32 is constituted by a nonvolatile memory which is writable from outside, and is capable of setting an optional boundary address generated at the time of shipping or by a user.

Further, when a control signal S10 from the control circuit CONT is supplied to the address comparison section 34 of the voltage control signal generation circuit 30, same compares, during a read operation, the internal address Add and the boundary address BA, and either one of the first and second voltage control signals EN1, EN2 is controlled to assume an H level. Further, other than during a read operation, the first voltage control signal EN1 is controlled to assume an H level, and the boost voltage VPP is adjusted to a higher potential.

Furthermore, during a programming operation, a programming verify operation, which confirms whether or not sufficient charge has been injected into the floating gate and whether the threshold voltage has risen to a desired level, is performed. This verify operation is an operation analogous with a read operation, and also at such time, as during a read operation, the potentials of non-selected word lines in the first memory cell array region and the second memory cell array region, respectively, may be made different. In such a case, the address comparison section 34 performs an address comparison operation in response to the control signal S10.

Figure 7:
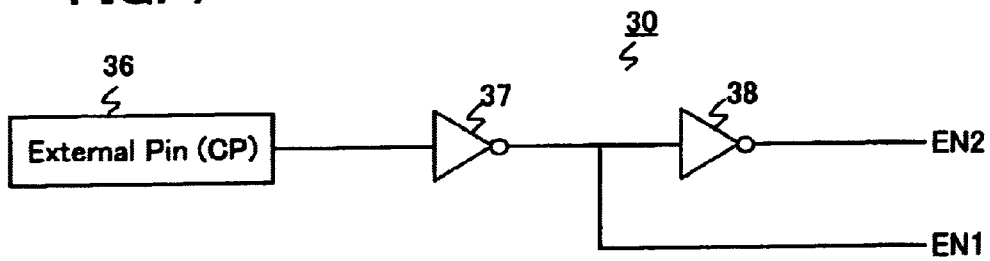
FIG. 7 shows another example of a voltage control signal generation circuit.

FIG. 7 shows another example of a voltage control signal generation circuit. This voltage control signal generation circuit 30 is an example that corresponds to the memory cell array constitution in FIG. 3 or the memory cell array constitution in FIG. 4. The voltage control signal generation circuit 30 in FIG. 7 is constituted by an external control pin 36 and inverters 37, 38, and, in accordance with control signals supplied to the external control pin 36, controls the first voltage control signal EN1 or the second voltage control signal EN2 to assume an H level.

In the voltage control signal generation circuit in FIG. 7, a memory controller for controlling the flash memory supplies, to the external control pin 36, a control signal, which controls, at an H level, either one of the first and second voltage control signals EN1, EN2 in accordance with a memory cell block which is subject to access and a controlled operation (a read operation, programming operation, or the like). That is, the memory controller holds a memory map for the flash memory and controls the voltage control signals EN1, EN2 in accordance with this memory map. This memory map comprises a map of the first memory cell blocks and the second memory cell blocks.

Therefore, with the memory cell array constitution in FIG. 3, when, during a read operation, the memory controller accesses an address equal to or higher than the boundary address BA, the memory controller supplies a control signal (CP=H) which sets the second voltage control signal EN2 at an H level, and when accessing an address lower than the boundary address BA, supplies a control signal (CP=L) which sets the first voltage control signal EN1 at an H level. Further, also with the memory cell array constitution in FIG. 4, similarly, as a result of the memory controller supplying a control signal, the voltage control signal generation circuit 30 can be made to generate a voltage control signal corresponding to a memory cell block which is to be accessed. In addition, the memory controller supplies these control signals in accordance with an operation mode, and is capable of optionally controlling the potential of non-selected word lines at a first potential or at a lower second potential.

Figure 8:
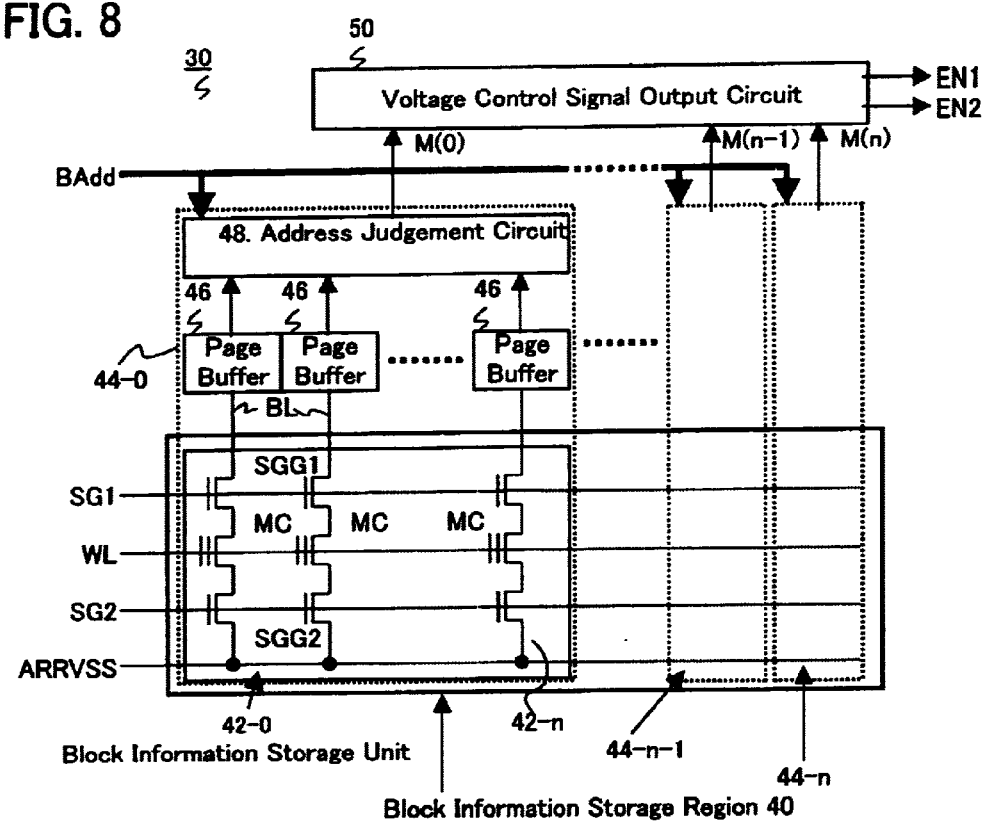
FIG. 8 shows another example of a voltage control signal generation circuit.

FIG. 8 shows yet another example of a voltage control signal generation circuit. This voltage control signal generation circuit 30 comprises a block information storage region 40 for storing block addresses of memory cell blocks assigned to the second memory cell blocks. Further, this block information storage region 40 is divided into block information storage units 42-0 to 42-n. Memory cell block judgement circuits 44-0 to 44-n, which judge whether or not access is to the second memory cell blocks, comprise the block information storage units 42-0 to 42-n of the block information storage region 40, a page buffer 46, and an address judgement circuit 48. Further, the memory cell block judgement circuits 44-0 to 44-n are provided in a quantity equal to the number of memory cell blocks (n).

Similarly to an ordinary memory cell array, the block information storage unit 42-0 comprises a segment, which is constituted by memory cells MC and segment gates SGG1, SGG2 connected on both sides of the memory cells MC, in a quantity equal to a block address bit count. The second segment gate SGG2 is connected to a cell array source voltage ARRVSS, and the first segment gate SGG1 is connected to the page buffers 46. The block information storage unit 42-0 stores a block address of a memory cell block which is allocated to the second memory cell array group. Also, a stored block address is read out by the page buffers 46, and the address judgement circuit 48 judges whether or not there is a match between a stored block address and a block address BAdd which is supplied from outside.

The address judgement circuit 48 supplies a match signal M(0) to the voltage control signal output circuit 50. The other memory cell array judgement circuit 48 also supplies match signals M(1) to M(n) to the voltage control signal output circuit 50. Further, if all of the match signals M(0) to M(n) are no-match signals, the voltage control signal output circuit 50 sets the first voltage control signal EN1 at an H level, and if even a single match signal is a signal for a match, the voltage control signal output circuit 50 sets the second voltage control signal EN2 at an H level.

Therefore, the voltage control signal generation circuit 30 in FIG. 8 is applicable to the memory cell array constitution in FIG. 3 or FIG. 4. Since it is possible to set every memory cell block as a second memory cell block, the voltage control signal generation circuit 30 is more suited to the memory cell array constitution in FIG. 4.

The memory cell block judgement circuits 44 are provided in a quantity equal to the number of memory cell blocks (n), meaning that memory cell blocks can be allocated to the second memory cell blocks up to a maximum quantity n. In other words, all of the memory cell blocks can be allocated to the second memory cell block group. Also, when assigning to the second memory cell blocks is only permitted up to a quantity k (k<n) which represents a maximum for a given flash memory, the memory cell block judgement circuits 44 may also be provided in a quantity k.

Alternatively, when it is possible to store, in the block information storage units 42, either of a block address allocated to a second memory cell block and a block address allocated to a first memory cell block, the memory cell block judgement circuits 44 can be provided in a quantity equal to half the block number n. In such a case, it is necessary to make it possible to also selectively modify the constitution of the voltage control signal output circuit as described hereinafter.

Figure 9:
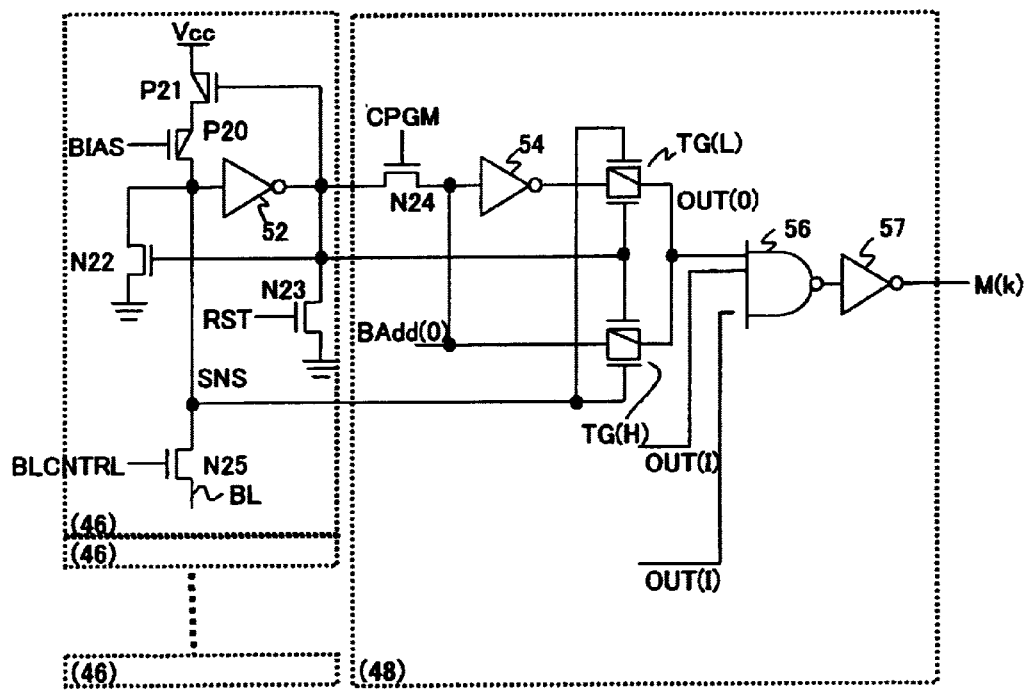
FIG. 9 shows the constitution of a page buffer and an address judgement circuit of the voltage control signal generation circuit in FIG. 8.

FIG. 9 shows the constitution of a page buffer and an address judgement circuit of the voltage control signal generation circuit in FIG. 8. In the page buffer 46, an N channel transistor N25, which is conductive by a bit line control signal BLCNTRL, is connected to a bit line BL of a segment of the block information storage unit 42. In a state where the word lines WL are controlled at the selected word line potential, when the threshold of a memory cell MC is low (data 1 is stored as an erase state), the memory cell is conductive, and the bit line BL is at an L level and a node SNS is at an L level. In accordance with the L level of the node SNS, an inverter 52 outputs an H level, and a latch transistor N22 is conductive and latches on to the L level of the node SNS.

In response to the L level of the node SNS, a first transfer gate TG(L) is conductive, and if a supplied block address BAdd(0) is also at an L level, an H level, which has been inverted by an inverter 54 is outputted as an output signal OUT(0). If the supplied block address BAdd(0) is at an H level, an L level is outputted as an output signal OUT(0).

On the other hand, when the threshold of a memory cell MC is high, the memory cell is non-conductive, and the node SNS assumes an H level, and, accordingly, a P channel transistor P21 is conductive and latches this state. Consequently, a second transfer gate TG(H) in the address judgement circuit 48 is conductive, and if a supplied block address BAdd(0) is also at an H level, an H level output signal OUT(0) is outputted. In other words, the address judgement circuit 48 functions as an ENOR circuit, and, in the event of a match between a supplied block address BAdd, and a block address stored in the block information storage unit 42-0, outputs an H level, and when no match exists, outputs an L level.

A NAND gate 56 in the address judgement circuit 48 also has other output signals OUT(1) to OUT(l) supplied thereto, and, when there is a match between all of the block addresses, the NAND gate 56 outputs an L level, and sets a match signal M(k) at an H level. If even one block address does not match, the match signal M(k) is set to an L level.

A transistor P20 in the page buffer has a bias signal BIAS supplied to the gate thereof such that a fixed current is supplied to the node SNS. Further, a transistor N23 is a reset transistor controlled by a reset signal RST. When the transistor N23 is made conductive by the reset signal RST, the transistor P21 is conductive, and the node SNS is reset to an H level. Also, a transistor N24 is controlled by a programming signal CPGM to be conductive and permit writing of a block address from an external address BAdd, during writing of block addresses in the block information storage units 42, and to be non-conductive during reading out of block addresses in the block information storage units 42.

The page buffer circuit 46 shown in FIG. 9 is constituted in substantially the same manner as the page buffer circuit of the page buffer group PB shown in FIG. 1.

Figure 10:
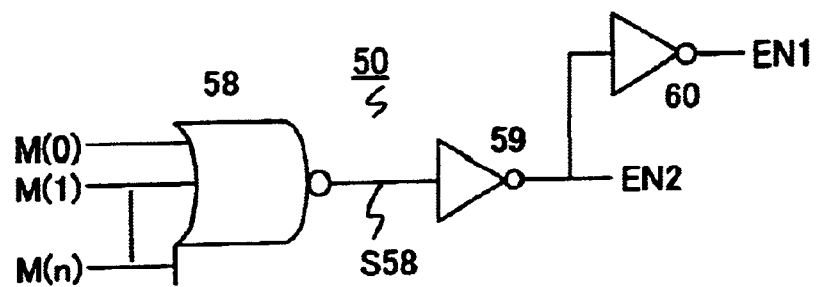
FIG. 10 shows the constitution of a voltage control signal output circuit 50 of the voltage control signal generation circuit 30 in FIG. 8.

FIG. 10 shows the constitution of a voltage control signal output circuit 50 of the voltage control signal generation circuit 30 in FIG. 8. The voltage control signal output circuit 50 comprises a NOR gate 58, to which match signals M(0) to M(n) from each of the address judgement circuits 48 are inputted, and inverters 59, 60. Further, when any one of the match signals M(0) to M(n) assumes an H level, the second voltage control signal EN2 is controlled to assume an H level, and when all of the match signals M(0) to M(n) are at an L level, the first voltage control signal EN1 is controlled to assume an L level.

When a block address, which is stored in the block information storage unit 42 described earlier, is selectable as either of a first block address and a second block address, it is necessary to accordingly also permit modification of the constitution of the voltage control signal output circuit 50.

As described above, as a result of a block address which is to be assigned to a second memory cell block being written into any one of the block information storage units 42-0 to 42-n which are within the voltage control signal generation circuit 30 shown in FIG. 8, at the time of shipping or by a user, optional memory cell blocks can be assigned to the second memory cell blocks. In the assigned memory cell blocks, the voltage of non-selected word lines during a read operation is controlled so as to be a low voltage in comparison with the first memory cell blocks. As a result, a read disturb can be avoided, and a data change can be avoided.

In the embodiment above, the voltage of non-selected word lines during a read operation is controlled so as to be lower for the second memory cell blocks than for the first memory cell blocks. However, with flash memory, an operation equivalent to a read operation is performed also at the time of a programming verify operation during a programming operation. Therefore, at the time of a programming verify operation, the potential of non-selected word lines can also be set low in the second memory cell blocks. However, the second memory cell blocks have a restricted programming frequency, meaning that the frequency for the programming verify operation is also small. Consequently, even if the potential of non-selected word lines is normally high, read disturb effects are accordingly small. Stated differently, even if the potential of non-selected word lines is set to be lower than usually, this does not result in a proportionately substantial benefit suppressing read disturb effects.

Further, a constitution is also possible such that, of the block addresses of the memory cell blocks, only some higher addresses are stored in the block information storage units 42 of the voltage control signal generation circuit shown in FIG. 8. In such a case, the memory cell array constitution in FIG. 3 can be implemented. A constitution is also possible such that, of the block addresses of the memory cell blocks, only some lower addresses are stored in the block information storage units 42. Here, analogous with the memory cell array constitution in FIG. 4, discrete memory cell blocks can be allocated to the second memory cell blocks.

Furthermore, the boundary address of the boundary address storage section 32 shown in FIG. 6 may also be made variable. In such a case, a change to the boundary address involving a change from the second memory cell array to the first memory cell array is preferable, that is, in the example in FIG. 3, it is preferable to permit only a change of the boundary address to a higher address. This is true because, when memory cells, which have been subjected to rewriting of a certain frequency, are allocated to the second memory cell array, there is a risk that read problems will be produced by over-programming.

In a more preferable example of the above embodiment, the second memory cell array is set as a partial region of the whole memory cell array, programs and data, and the like, which are read out frequently, being stored therein, and the first memory cell array is set as the greater part of the region of the whole memory cell array, data which is rewritten frequently being stored therein. By allocating a larger region to the first memory cell array, at a point in time when readout failure occurs as a result of degradation of the tunnel oxide film after frequent rewriting, even if use of corresponding memory cell blocks is then prohibited, the first memory cell array is capable of retaining sufficient capacity. However, the second memory cell array has a restricted rewrite frequency, meaning that there is a small possibility for a degradation of the tunnel oxide film.

By means of the present invention hereinabove, it is possible to suppress the occurrence of flash memory read problems and to suppress a data change caused by a read disturb.

What is claimed is:

1. A nonvolatile memory, comprising:
   a memory cell array, which has a plurality of bit lines, a plurality of word lines, and a segment, which is connected to said bit lines and in which a plurality of memory cells are connected in series, said word lines being connected to gates of said memory cells; and
   a word driver circuit, which applies a selected word line voltage to a selected memory cell word line within said segment, and applies a non-selected word line voltage, which causes the memory cells to conduct, to a non-selected memory cell word line,
   wherein said memory cell array is divided into a first memory cell array and a second memory cell array, and said non-selected word line voltage in said first memory cell array is set as a first voltage, and said non-selected word line voltage in said second memory cell array is set as a second voltage which is lower than said first voltage.

2. The nonvolatile memory according to claim 1, wherein each of said bit lines has a plurality of segments, and said memory cell array is divided, in units of said segments, into said first memory cell array and second memory cell array.

3. The nonvolatile memory according to claim 1, wherein said memory cell array has a plurality of memory cell blocks, and said memory cell array is divided, in memory cell block units, into said first memory cell array and second memory cell array.

4. The nonvolatile memory according to claim 3, further comprising:
   a voltage control signal generation circuit, which generates voltage control signal that controls said non-selected word line voltage to be a first voltage or a second voltage,
   wherein the voltage control signal generation circuit has block information storage units for storing block addresses that distinguish said first and second memory cell arrays.

5. The nonvolatile memory according to claim 4, wherein said block information storage units are constituted so as to be rewritable from outside.

6. The nonvolatile memory according to claim 1, wherein a rewrite possible times of said second memory cell array is smaller than a rewrite possible times of said first memory cell array.

7. The nonvolatile memory according to claim 1, further comprising:
   a voltage control signal generation circuit, which generates voltage control signal that controls said non-selected word line voltage to be a first voltage or a second voltage,
   wherein the voltage control signal generation circuit has an address storage section for storing addresses that distinguish said first and second memory cell arrays.

8. The nonvolatile memory according to claim 7, wherein said address storage section is rewritable from outside.

9. The nonvolatile memory according to claim 7, wherein said address storage section stores a boundary address of said first and second memory cell arrays, and said voltage control signal generation circuit compares a supplied address and the boundary address and generates said voltage control signals in accordance with a result of the comparison.

10. The nonvolatile memory according to claim 7, wherein said address storage section stores addresses of said first or second memory cell arrays, and said voltage control signal generation circuit compares a supplied address and the stored addresses and generates said voltage control signal in accordance with a result of the comparison.

11. The nonvolatile memory according to claim 1, further comprising:
    a voltage control signal generation circuit, which generates voltage control signal that controls said non-selected word line voltage to be a first voltage or a second voltage,
    wherein the voltage control signal generation circuit generates said voltage control signal according to a control signal supplied from outside.

12. The nonvolatile memory according to claim 1, wherein a capacity of said first memory cell array is larger than a capacity of the second memory cell array.

13. A nonvolatile memory, comprising:
    a memory cell array, which has a plurality of bit lines, a plurality of word lines, and a plurality of memory cells whose gates are connected to said word lines; and
    a word driver circuit, which, during a read operation, applies a selected word line voltage to a selected memory cell word line, and applies a non-selected word line voltage, which causes the memory cells to conduct, to a non-selected memory cell word line,
    wherein said memory cell array is divided into a first memory cell array which is assured a first rewrite times, and a second memory cell array which is assured a second rewrite times smaller than said first rewrite times; and wherein said non-selected word line voltage in said first memory cell array is set as a first voltage, and said non-selected word line voltage in said second memory cell array is set as a second voltage which is lower than said first voltage.

* * * * *